(12) United States Patent
Watanabe

(10) Patent No.: US 8,333,458 B2
(45) Date of Patent: Dec. 18, 2012

(54) DROPLET DISCHARGE HEAD AND INK JET HEAD

(75) Inventor: Hidetoshi Watanabe, Tokoname (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 490 days.

(21) Appl. No.: 12/538,734

(22) Filed: Aug. 10, 2009

(65) Prior Publication Data

US 2010/0033535 A1    Feb. 11, 2010

(30) Foreign Application Priority Data

Aug. 8, 2008    (JP) ................................. 2008-205772

(51) Int. Cl.
*B41J 2/135* (2006.01)
(52) U.S. Cl. ......................................................... 347/44
(58) Field of Classification Search ....................... 347/44
See application file for complete search history.

(56) References Cited

U.S. PATENT DOCUMENTS

| 6,550,897 | B2 | 4/2003 | Nakamura et al. |
| 2003/0156165 | A1 | 8/2003 | Sakaida |
| 2005/0068375 | A1 | 3/2005 | Hibi et al. |
| 2006/0012622 | A1 | 1/2006 | Kusunoki |
| 2006/0066684 | A1* | 3/2006 | Sugahara ........................ 347/68 |

FOREIGN PATENT DOCUMENTS

| JP | 2002-248765 A | 9/2002 |
| JP | 2003-311954 A | 11/2003 |
| JP | 2005-021779 A | 1/2005 |
| JP | 2006-019718 A | 1/2006 |
| JP | 2006-027132 A | 2/2006 |
| JP | 2006-035500 A | 2/2006 |
| JP | 2006-082346 A | 3/2006 |
| JP | 2006-231530 A | 9/2006 |

OTHER PUBLICATIONS

Japan Patent Office, Notification of Reasons for Refusal for Japanese Patent Application No. 2008-205772 (counterpart Japanese patent application), dispatched Oct. 9, 2012.

* cited by examiner

*Primary Examiner* — Matthew Luu
*Assistant Examiner* — Renee I Wilson
(74) *Attorney, Agent, or Firm* — Baker Botts L.L.P.

(57) ABSTRACT

A droplet discharge head is provided. The droplet discharge head includes: a discharge port through which a droplet is discharged; a liquid channel which communicates with the discharge port; and an actuator which includes a deformation layer defining a part of wall surfaces of the liquid channel and an electrode facing the liquid channel through the deformation layer, and which causes the deformation layer to deform toward the liquid channel when a drive signal is supplied to the electrode. A groove is formed on a surface of the electrode opposite to the deformation layer.

10 Claims, 11 Drawing Sheets

DROPLET DISCHARGE HEAD AND INK JET HEAD

CROSS-REFERENCE TO RELATED APPLICATION

This application claims priority from Japanese Patent Application No. 2008-205772, filed on Aug. 8, 2008, the entire subject matter of which is incorporated herein by reference.

TECHNICAL FIELD

Aspects of the present invention relate to a droplet discharge head and an ink jet head which include an actuator for discharging droplets from a discharge port.

BACKGROUND

A piezoelectric actuator is known as an example of an actuator which discharges droplets from a discharge port. The piezoelectric actuator includes a vibrating plate, a piezoelectric ceramic layer which is laminated on the vibrating plate, and a surface electrode which is disposed on the surface of the piezoelectric ceramic layer. When the piezoelectric actuator is used in a liquid discharge apparatus, the piezoelectric actuator is disposed on a pressure chamber member which includes a liquid pressure chamber. The surface electrode faces the liquid pressure chamber through the piezoelectric ceramic layer and the vibrating plate. When a drive signal is applied to the surface electrode, the piezoelectric ceramic layer and the vibrating plate are deformed and pressure is applied to a liquid contained in the liquid pressure chamber.

According to the above-described actuator, a deformation layer is deformed plural times. Therefore, there is a concern that a crack is generated in the actuator. If the crack reaches the surface of the electrode from a liquid channel, there is a concern that liquid leaks from the surface of the electrode and a short circuit may occur between the electrode and other conductive portions.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a droplet discharge head and an ink jet head which hardly generate a short circuit between an electrode and other conductive portions even though liquid leaks from the surface of an electrode.

According to an exemplary embodiment of the present invention, there is provided a droplet discharge head comprising: a discharge port through which a droplet is discharged; a liquid channel which communicates with the discharge port; and an actuator which includes a deformation layer defining a part of wall surfaces of the liquid channel and an electrode facing the liquid channel through the deformation layer, and which causes the deformation layer to deform toward the liquid channel when a drive signal is supplied to the electrode, wherein a groove is formed on a surface of the electrode opposite to the deformation layer.

According to another exemplary embodiment of the present invention, there is provided an ink jet head comprising: a channel unit including: a nozzle which discharges ink; an ink supply port, to which ink is supplied from an outside; a rhombic pressure chamber with rounded corners, the pressure chamber having an opening open to one surface of the channel unit; and an ink channel which communicates the nozzle with the ink supply port through the pressure chamber; and an actuator which is fixed to the one surface of the channel unit, and which applies a discharge energy to ink contained in the pressure chamber to be discharged from the nozzle. The actuator includes: a plurality of piezoelectric layers which are laminated to close the opening of the pressure chamber, an individual electrode which has a shape similar to a shape of the pressure chamber, and which is disposed on an upper surface of an uppermost piezoelectric layer most distant from the pressure chamber so as to face the pressure chamber, and a common electrode which is disposed to sandwich the uppermost piezoelectric layer with the individual electrode. The individual electrode is formed with a groove which extends along an outer edge of the individual electrode and exposes the upper surface of the uppermost piezoelectric layer to an outside, and at least two connecting portions which electrically connect an inner region of the individual electrode defined by the groove with an outer region outside of the inner region in the individual electrode. A centroid of the inner region overlaps a centroid of the individual electrode. The at least two connecting portions are formed at positions which are symmetric with respect to the centroid of the individual electrode.

According to the above configuration, since the groove is formed on the surface of the electrode, leaking fluid is apt to flow into the groove. Accordingly, it may be possible to suppress a short circuit caused between the electrode and other conductive portions.

BRIEF DESCRIPTION OF THE DRAWINGS

The above and other aspects of the present invention will become more apparent and more readily appreciated from the following description of exemplary embodiments of the present invention taken in conjunction with the attached drawings, in which.

DETAILED DESCRIPTION

Exemplary embodiments of the present invention will be described below with reference to drawings.

Figure 1:
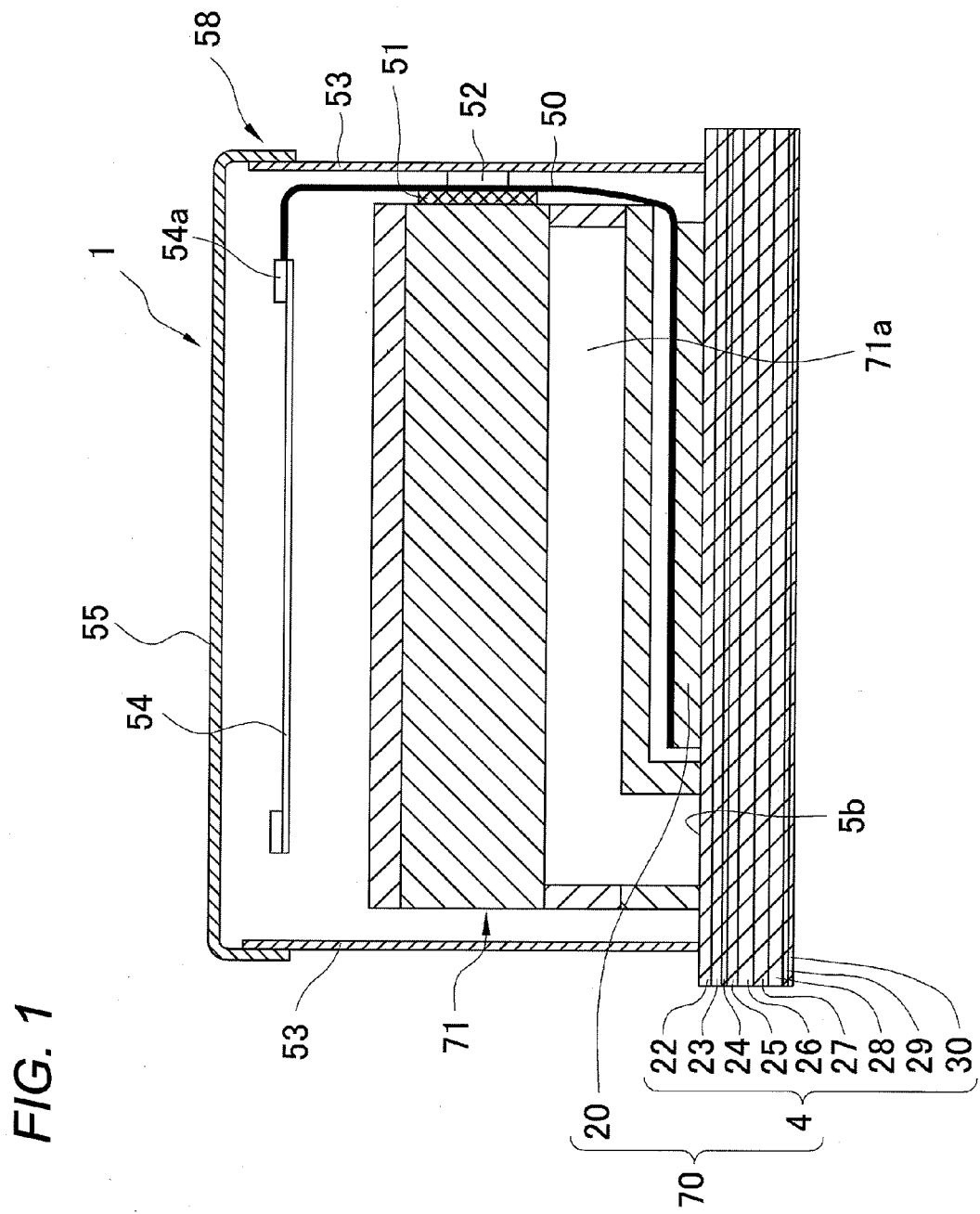
FIG. 1 is a longitudinal sectional view of an ink jet head according to an exemplary embodiment of the present invention.

As shown in FIG. 1, an ink jet head 1 includes a head body 70 which discharges ink, a reservoir unit 71 which is disposed on an upper surface of the head body 70, a flexible printed circuit board (FPC) 50 which is electrically connected to the head body 70, and a control board 54 which is electrically connected to the FPC 50. The head body 70 includes a channel unit 4 in which an ink channel is formed, and an actuator unit 20. The reservoir unit 71 supplies ink to the channel unit 4. One end of the FPC 50 is connected to an upper surface of the actuator unit 20, and a driver IC 52, which supplies a drive signal to the actuator unit 20, is mounted on the FPC 50.

Figure 2:
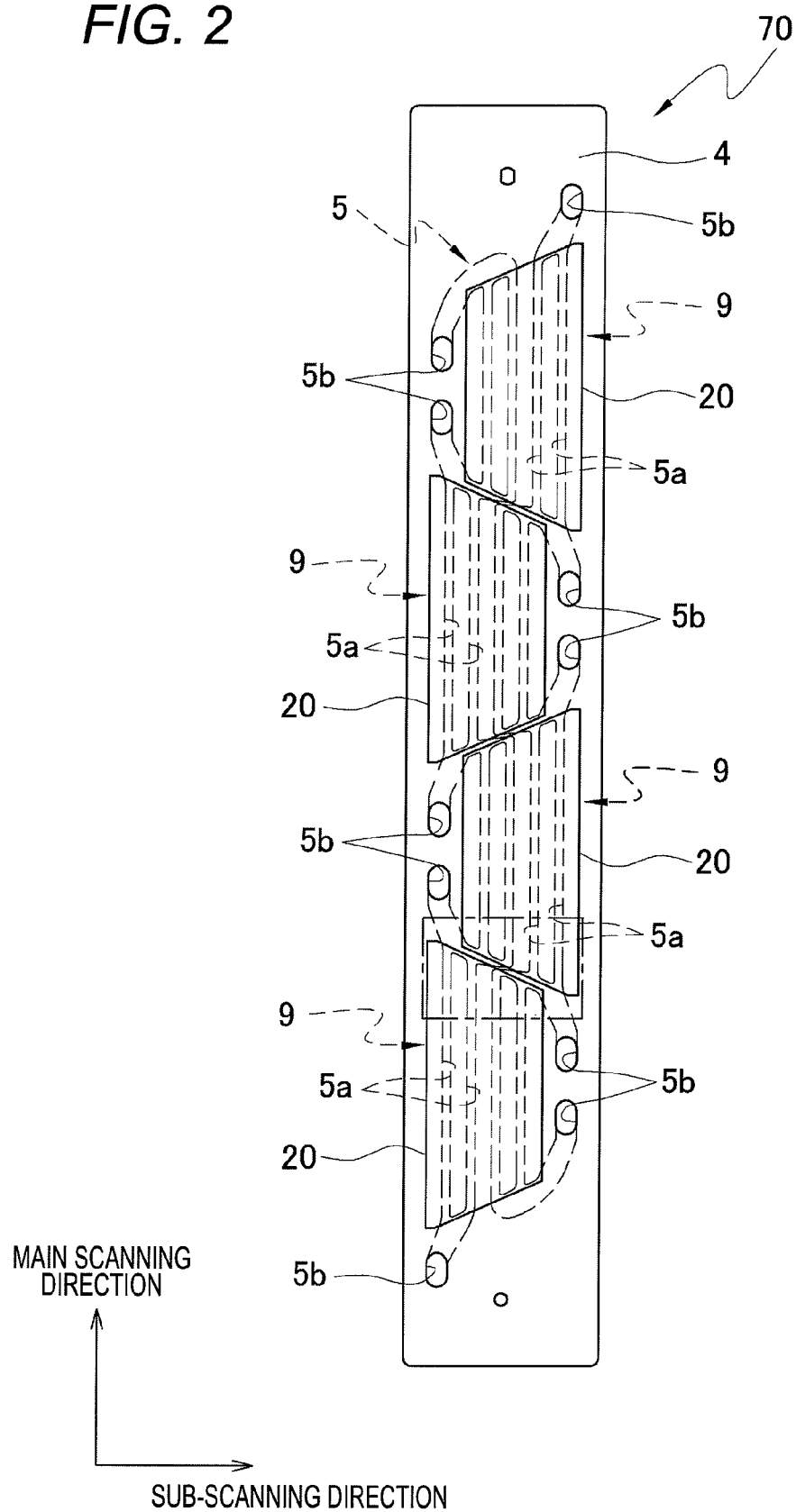
FIG. 2 is a plan view of a head body of FIG. 1.

As shown in FIG. 2, ten ink supply ports 5b, which respectively communicate with the internal ink channel, are formed on the upper surface of the head body 70. The ink supply ports 5b are opened to the upper surface of the channel unit 4. As described below, the ink channel includes a pressure chamber 10 (liquid chamber) which is formed on the upper surface of the channel unit 4, and a nozzle 8 which communicates with the pressure chamber 10 and discharges ink. Meanwhile, a filter (not shown), which covers each of the ink supply ports 5b and captures foreign materials mixed to ink, is provided on the upper surface of the channel unit 4.

The control board 54 is horizontally disposed above the reservoir unit 71, and the other end of the FPC 50 is connected to the control board 54 by a connector 54a. Further, the driver IC 52 supplies a drive signal to the actuator unit 20 through wiring of the FPC 50 based on a command from the control board 54.

The reservoir unit 71 is disposed above the head body 70. The reservoir unit 71 includes an ink reservoir 71a which stores ink therein, and the ink reservoir 71a communicates with the ink supply ports 5b of the channel unit 4. Accordingly, ink stored in the ink reservoir 71a is supplied to the ink channel, which is formed in the channel unit 4, through the ink supply ports 5b.

The actuator unit 20, the reservoir unit 71, the control board 54, the FPC 50, and the like are covered with a cover member 58. The cover member 58 includes a side cover 53 and a head cover 55. Accordingly, the incursion of ink or ink mist, which is scattered to the outside, is prevented. The cover member 58 is made of a metal material. Further, an elastic sponge 51 is provided on the side surface of the reservoir unit 71. As shown in FIG. 1, the driver IC 52 mounted on the FPC 50 is provided at a position which faces the sponge 51, so that the driver IC 52 is pressed against the inner surface of the side cover 53 by the sponge 51. Accordingly, heat generated by the driver IC 52 is transferred to the head cover 55 via the side cover 53, and is quickly dissipated to the outside through the cover member 58 which is made of metal. That is, the cover member 58 functions as a heat dissipating member.

Figure 3:
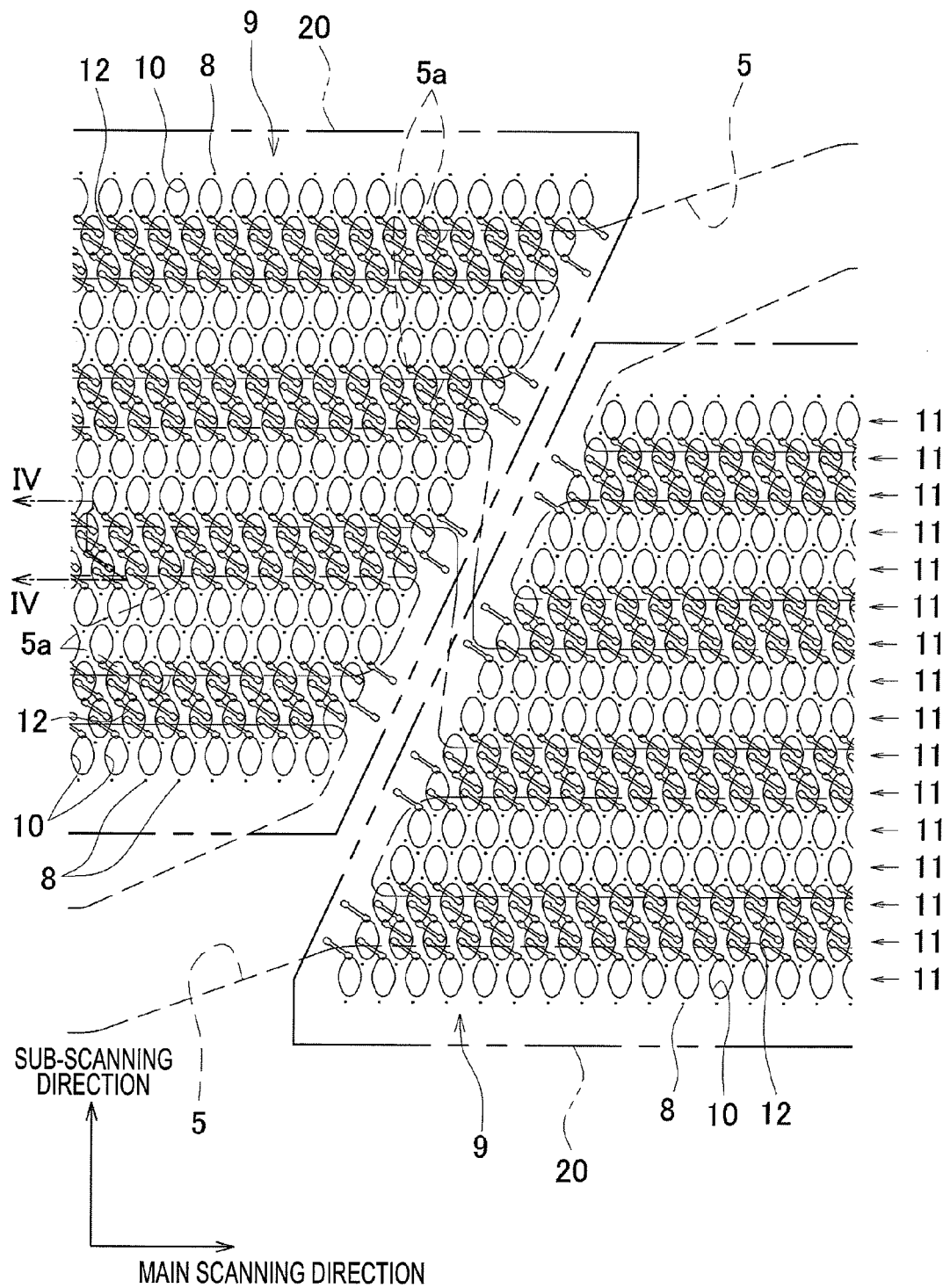
FIG. 3 is an enlarged view of a region which is surrounded by a dashed-dotted line in FIG. 2.

The head body 70 will be described in detail below. As shown in FIG. 2, the channel unit 4 has a rectangular shape, which is elongated in a main scanning direction, in plan view. As shown in FIGS. 2 and 3, the channel unit 4 includes a plurality of pressure chamber groups 9 in which the pressure chambers 10 are distributed in ranges having a trapezoidal shape in plan view. Each of the pressure chambers 10 is opened to the upper surface of the channel unit 4. Further, each of the pressure chambers 10 has a rhombic shape with rounded corners in plan view.

In this exemplary embodiment, 16 pressure chamber arrays 11 are arranged parallel to one another. Each of the pressure chamber arrays includes a plurality of pressure chambers 10 arranged at a constant interval in the longitudinal direction (main scanning direction) of the channel unit 4. The pressure chamber arrays 11 are arranged at a predetermined interval in a direction (sub-scanning direction) orthogonal to the longitudinal direction of the channel unit 4. The number of pressure chambers 10 included in the pressure chamber array 11 is gradually decreased from a long side of the pressure chamber group 9 to a short side thereof. The pressure chambers 10 are disposed in the form of a matrix in two directions (in the main scanning direction and a direction crossing the main scanning direction) so that an acute portion of a pressure chamber 10 is disposed between acute portions of adjacent two pressure chambers 10. Accordingly, as shown in FIG. 3, the plurality of pressure chambers 10 are provided so that a straight line, which connects one acute portions of the pressure chambers 10 of one pressure chamber array 11 crosses oblique sides of the pressure chambers 10 of a pressure chamber array 11 adjacent thereto in the sub-scanning direction.

As shown in FIG. 2, four trapezoidal actuator units 20 are attached to the upper surface of the channel unit 4 in two lines in zigzags so as to correspond to the disposition of the pressure chamber groups 9. Regions of the lower surface of the channel unit 4, which face the regions where the actuator units 20 are attached, form ink discharge regions where the openings (discharge ports) of the nozzles 8 are distributed. The ink discharge region has a trapezoidal shape similarly to the actuator unit 20. Similarly to the pressure chambers 10, these nozzles 8 are also disposed in the form of a matrix and form a plurality of nozzle arrays. The nozzles 8 are disposed in the ink discharge regions so as to form an image as a whole with a resolution of 600 dpi in the main scanning direction.

As shown in FIGS. 2 and 3, a manifold channel 5 communicating with the ink supply ports 5b and sub-manifold channels 5a branched from the manifold channel 5 are formed in the channel unit 4. The manifold channel 5 extends along oblique sides of the actuator units 20 so as to intersect the longitudinal direction of the channel unit 4. In the region interposed between two actuator units 20, one manifold channel 5 is common to adjacent actuator units 20 and the sub-manifold channels 5a are branched from both sides of the manifold channel 5. Further, in regions facing the trapezoidal ink discharge regions, the sub-manifold channels 5a extend in the longitudinal direction of the channel unit 4. Both ends of the sub-manifold channel 5a communicate with the manifold channel 5 in the vicinity of the oblique sides of the ink discharge regions, so that the sub-manifold channels 5a form a closed loop for ink discharge region.

The nozzles 8 communicate with the sub-manifold channels 5a through the pressure chambers 10 and apertures 12 which are throttle channels, respectively. Meanwhile, in order to easily understand the drawing, in FIG. 3, the actuator units 20 are shown by a two-dot chain line, and the pressure chambers 10, the apertures 12, and the nozzles 8, which are to be shown by a broken line at the lower portion of the actuator unit 20, are shown by a solid line.

Figure 4:
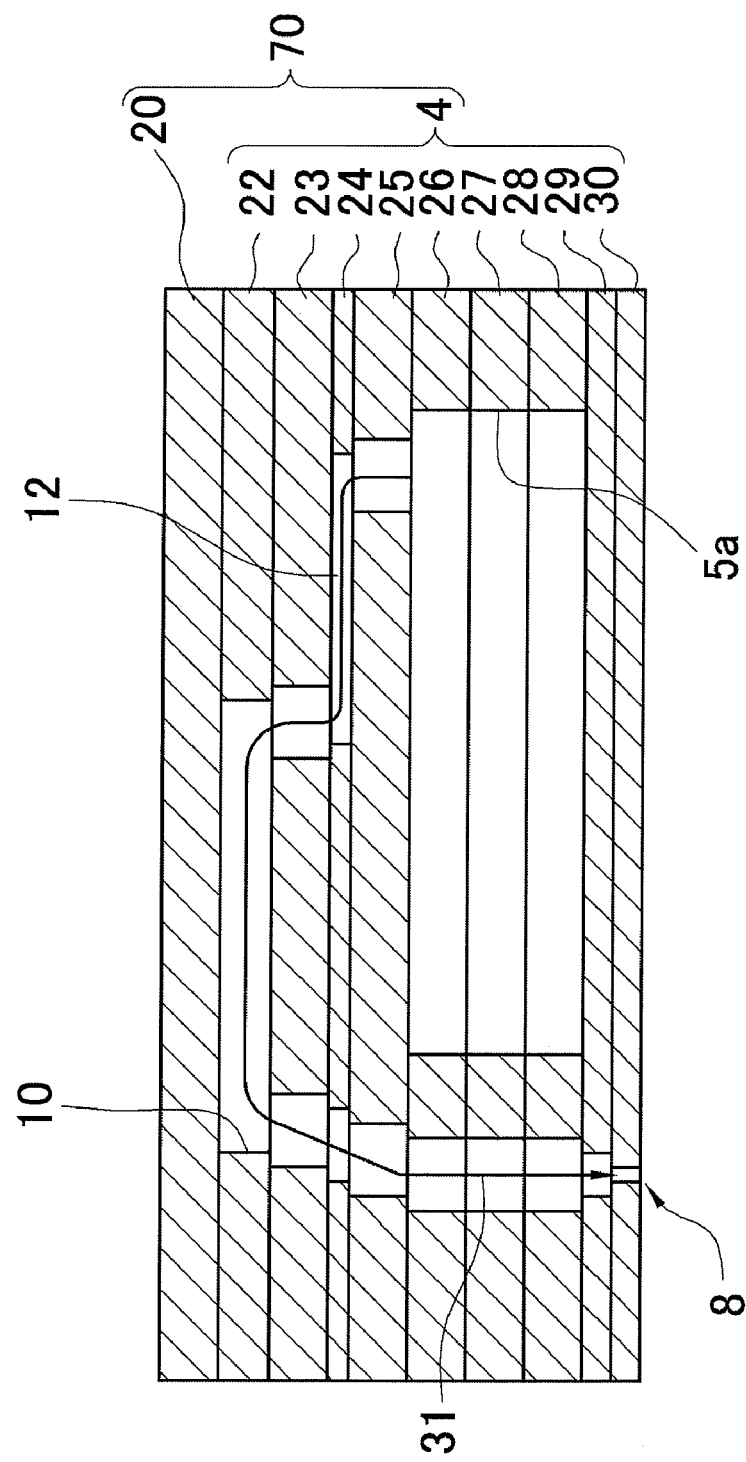
FIG. 4 is a cross-sectional view taken along a line IV-IV of FIG. 3.

The sectional structure of the head body 70 will be described below. As shown in FIG. 4, the channel unit 4 has a laminated structure including nine metal plates made of stainless steel. Specifically, the channel unit 4 includes a cavity plate 22 (channel forming member), a base plate 23, an aperture plate 24, a supply plate 25, manifold plates 26, 27, and 28, a cover plate 29, and a nozzle plate 30 laminated from above. Each of the plates 22 to 30 has an elongated rectangular shape in plan view. The actuator unit 20 is attached (fixed) to the upper surface of the cavity plate 22.

A plurality of through holes corresponding to the ink supply ports 5b, and a plurality of substantially rhombic through holes corresponding to the portions of the pressure chambers 10 are formed at the cavity plate 22. For each of the pressure chambers 10, a communication hole between the pressure chamber 10 and the apertures 12, a communication hole between the pressure chamber 10 and the nozzle 8, and a communication hole between the ink supply ports 5b and the manifold channel 5 are formed in the base plate 23. For each of the pressure chambers 10, a through hole forming the apertures 12, a communication hole between the pressure chamber 10 and the nozzles 8, and a communication holes between the ink supply ports 5b and the manifold channel 5 are formed in the aperture plate 24. For each of the pressure chambers 10, a communication hole between the aperture 12 and the sub-manifold channel 5a, and a communication hole between the pressure chamber 10 and the nozzle 8 are formed in the supply plate 25.

For each of the pressure chambers 10, a communication hole between the pressure chamber 10 and the nozzle 8, and through holes which are connected to each other during the lamination and form the manifold channel 5 and the sub-manifold channel 5a are formed in the manifold plates 26 to 28. For each of the pressure chambers 10, a communication hole between the pressure chamber 10 and the nozzle 8 is formed in the cover plate 29. For each of the pressure chambers 10, a hole facing the nozzle 8 is formed in the nozzle plate 30.

If these nine plates 22 to 30 are laminated while being aligned with each other, the channel unit 4 is formed. Each of the plates 22 to 30 is fixed by an adhesive, and an individual ink channel 31 (liquid channel) shown in FIG. 4 is formed in the channel unit 4. Meanwhile, the individual ink channel 31 is a channel which reaches the nozzle 8 from the outlet of the sub-manifold channel 5a.

Through holes to form the pressure chambers 10 are formed in the cavity plate 22. As shown in FIG. 4, the through hole is provided between the upper surface of the base plate 23 and the lower surface of the actuator unit 20 in a vertical direction, so that the pressure chamber 10 is defined.

Figure 5A:
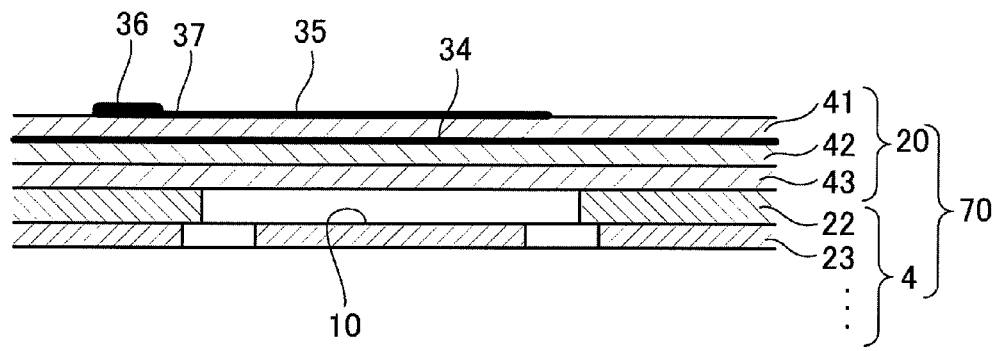
FIG. 5A is a cross-sectional view of a portion of the head body around a pressure chamber.

The actuator unit 20 will be described below. As shown in FIG. 5A, the actuator unit 20 includes three piezoelectric sheets 41 to 43 (piezoelectric layers), a plurality of individual electrodes 35 which are disposed on the upper surface of the piezoelectric sheet 41, and a common electrode 34 which is disposed between the piezoelectric sheets 41 and 42. The individual electrode 35, the piezoelectric sheet 41 (the uppermost piezoelectric layer), the common electrode 34, the piezoelectric sheet 42, and the piezoelectric sheet 43 (deformation layer) are laminated in this order from the side which is distant from the channel unit 4. The piezoelectric sheet 43 is attached to the upper surface of the channel unit 4 so as to close the opening of pressure chamber 10. Accordingly, the piezoelectric sheet 43 defines a wall surface of the pressure chamber 10.

Each of the piezoelectric sheets 41 to 43 is a flat plate which has the shape of a layer having a thickness of about 15 µm, and has shape and size covering one ink discharge region in plan view. Each of the piezoelectric sheets 41 to 43 is made of a lead zirconate titanate (PZT) ceramic material having ferroelectricity. Only the piezoelectric sheet 41 of the piezoelectric sheets 41 to 43 is polarized in a thickness direction thereof (the lamination direction of the piezoelectric sheets 41 to 43).

Figure 5B:
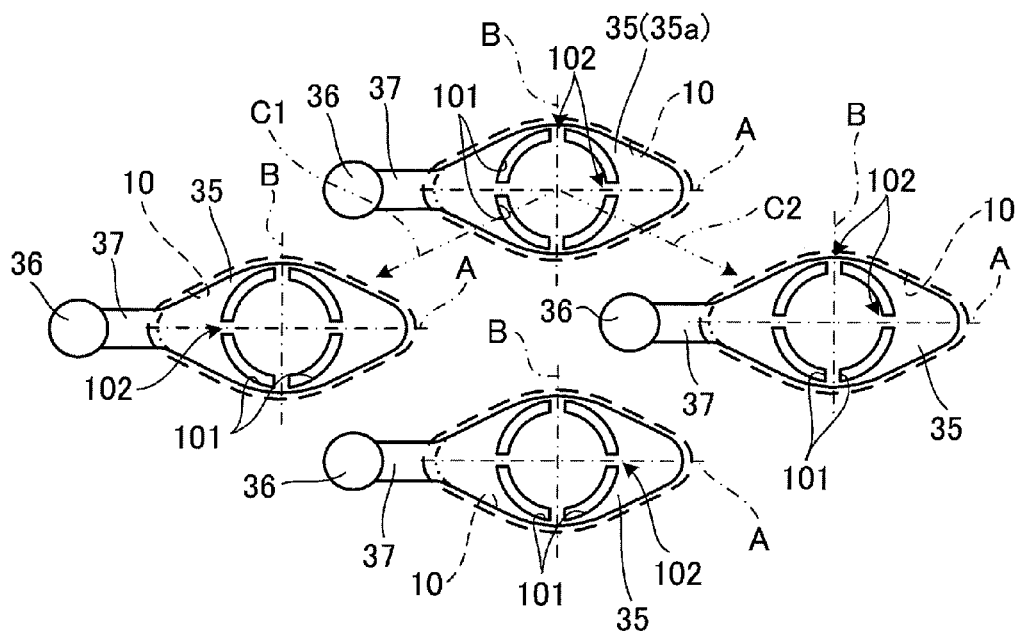
FIG. 5B is a plan view of a portion of the head body around the pressure chamber.

As shown in FIG. 5B, the individual electrode 35 has a rhombic shape, which has rounded corners and is substantially similar to the shape of the pressure chamber 10, in plan view, and is slightly smaller than the pressure chamber 10. In plan view, the centroid of the individual electrode 35 overlaps the centroid of the pressure chamber 10, and the individual electrode is disposed so that four sides of the individual electrode are parallel to four sides of the pressure chamber 10. In FIG. 5B, an intersection between dashed-dotted lines A and B indicates the position of the centroid of the individual electrode 35 and the position of the centroid of the pressure chamber 10. Accordingly, the individual electrode 35 is disposed at the center of the pressure chamber 10 so as to be included in the pressure chamber 10 in plan view.

In this exemplary embodiment, grooves 101 are formed in the individual electrode 35. The grooves 101 pass through the individual electrode 35 from the surface of the individual electrode, which faces the piezoelectric sheets 41 to 43, to an opposite surface of the individual electrode. Accordingly, regions of the upper surface of the piezoelectric sheet 41, which face the grooves 101, are exposed to the outside through the grooves 101. Meanwhile, if the grooves 101 are opened at the surface of the individual electrode 35 opposite to the surface facing the piezoelectric sheet 41, the grooves may not pass through the individual electrode 35.

In plan view, four grooves 101 are formed inside the outer peripheral edge of the individual electrode 35, and are formed along four arcs which have the same radius and have a center at the centroid of the individual electrode 35, respectively. Gaps among four grooves 101 are small, so that the four grooves 101 are formed along the entire circumference of a substantially complete circle as a whole. That is, the four grooves 101 substantially surround the centroid of the individual electrode 35.

Each of the grooves 101 of one individual electrode 35 extends in a direction crossing a direction from the centroid of the one individual electrode 35 another individual electrode 35 adjacent to the one individual electrode 35. For example, arrows C1 and C2 shown in FIG. 5B indicate directions from the centroid of one individual electrode 35a to adjacent individual electrodes 35, respectively. That is, the grooves 101 of the individual electrode 35a are formed so as to extend in a direction crossing the Four connecting portions 102 which connect the region of the individual electrode 35 surrounded by the grooves 101 with the outer region thereof, are formed between the grooves 101. Accordingly, conduction is secured between the region (inner region) which is surrounded by the grooves 101, and the region (outer region) which is provided outside the region. Two connecting portions of the four connecting portion 102 are disposed on a straight line A which is parallel to the longitudinal direction of the individual electrode 35 and passes through the centroid of the individual electrode 35. The two connecting portions have a positional relationship which is symmetric with respect to the centroid of the individual electrode 35. Further, the other two connecting portions of the four connecting portions 102 are disposed on a straight line B which is parallel to the width direction of the individual electrode 35 and passes through the centroid of the individual electrode 35. The other two connecting portions also have a positional relationship which is symmetric with respect to the centroid of the individual electrode 35. In other words, the centroid of the individual electrode 35 is positioned at an intersection between a straight line connecting two connecting portions 102 of the four connecting portions 102 which are most distant from each other, and a straight line connecting the other two connecting portions 102.

Further, two connecting portions, which are disposed on the straight line B, of the four connecting portions 102 are disposed at positions which are close to the corners of the individual electrode 35. That is, these two connecting portions 102 are disposed at positions which face the corners of the pressure chamber 10.

An extension portion 37, which extends in the longitudinal direction of the individual electrode 35, is formed at one end of the individual electrode 35 in the longitudinal direction. Each of the individual electrode 35 and the extension portion 37 has a thickness of about 1 µm, and is made of a metal material such as an Ag—Pd system alloy. The extension portion 37 extends outside the pressure chamber 10, and a land 36 is formed at the end of the extension portion. Meanwhile, the land 36 has a circular shape having a diameter of about 160 µm in plan view, and is made of gold containing glass frit. The land 36 is connected to a connection portion of wiring which is provided on the FPC 50, and the individual electrode 35 is connected to the driver IC 52, which is mounted on the FPC 50, by the land 36. The driver IC 52 supplies drive signals to respective individual electrodes 35, and individually controls the potentials of the individual electrodes 35.

The common electrode 34 has the same size as the piezoelectric sheet 41, and lies over all pressure chambers 10 belonging to one pressure chamber group 9. That is, the common electrode 34 faces all individual electrodes 35 which are formed at one actuator unit 20. Further, the common electrode 34 is grounded on a region (not shown, the upper surface of the piezoelectric sheet 41) through the FPC 50. Accordingly, the common electrode 34 is maintained at the same ground potential in the regions corresponding to all pressure chambers 10.

If the potential of the individual electrode 35 is different from the potential of the common electrode 34, an external electric field is generated in the region which is interposed between the individual electrode 35 and the common electrode 34. In this case, piezoelectric strain is generated in the region of the piezoelectric sheet 41, which is interposed between the individual electrode 35 and the common electrode 34, by the generation of the external electric field. As described above, an active portion where piezoelectric strain is generated is provided in the region of the piezoelectric sheet 41 which is interposed between the individual electrode 35 and the common electrode 34. Meanwhile, each of the piezoelectric sheets 42 and 43 is an inactive layer which does not include an active portion. The actuator unit 20 has a so-called unimorph type structure. Each of the portions, which are formed of the regions of the piezoelectric sheets 41 to 43 and the common electrode 34 facing the individual electrode 35 and the individual electrode 35, forms an actuator which applies discharge energy for each of the pressure chambers 10. The actuator unit 20 includes a plurality of individual actuators.

An operation when the actuator unit 20 is driven will be described below in detail. The driver IC 52 supplies a drive signal to the individual electrode 35 through the FPC 50. Accordingly, the potential of the individual electrode 35 is changed from the ground potential to a predetermined positive potential which is different from the ground potential, and then returns to the ground potential.

If the potential of the individual electrode 35 is changed to the predetermined positive potential, an electric field is generated between the individual electrode 35 and the common electrode 34. Accordingly, an external electric field, which is parallel to the lamination direction, is applied to the active portion of the piezoelectric sheet 41, so that the active portion is compressed in a direction orthogonal to the polarization direction by a lateral piezoelectric effect.

Meanwhile, since the other piezoelectric sheets 42 and 43 are not spontaneously compressed without the application of the external electric field, the other piezoelectric sheets function as a restrictive layer for restricting the active portion. Accordingly, unimorph deformation where the sheet protrudes toward the pressure chamber 10 occurs at the active portions of the piezoelectric sheets 41 to 43 and the portions facing the active portions, as a whole.

If the piezoelectric sheets 41 to 43 are deformed to protrude toward the pressure chamber 10, the volume of the pressure chamber 10 is decreased, so that the pressure of ink is increased. Accordingly, ink is discharged from the nozzle 8 that communicates with the pressure chamber 10. After that, when the potential of the individual electrode 35 returns to the ground potential, the shapes of the piezoelectric sheets 41 to 43 return to original shapes, so that the volume of the pressure chamber 10 also returns to original volume. Then, ink is suctioned from the sub-manifold channel 5a into the individual ink channel 31.

The following operation may be performed as another method of driving the actuator unit 20. The driver IC 52 previously sets the potential of the individual electrode 35 to a positive potential. In this case, the piezoelectric sheets 41 to 43 are in a state where unimorph deformation has previously occurred. Further, whenever discharge is required, the driver IC 52 sets the potential of the individual electrode 35 to the ground potential and then makes the potential of the individual electrode 35 return to a positive potential again at a predetermined timing. Accordingly, at a timing where the potential of the individual electrode 35 becomes the ground potential, the piezoelectric sheets 41 to 43 return to a state where deformation does not occur from a state where unimorph deformation has previously occurred. In this case, the volume of the pressure chamber 10 is increased, and ink is suctioned from the sub-manifold channel 5a into the individual ink channel 31. After that, at a timing where the potential of the individual electrode 35 becomes a positive potential again, the active portions of the piezoelectric sheets 41 to 43 and the portions facing the active portions are deformed to protrude toward the pressure chamber 10. Therefore, the volume of the pressure chamber 10 is decreased, so that the pressure of ink is increased and ink is discharged from the nozzle 8.

It is noted that, as described above, the individual electrode 35 is disposed at the center of the pressure chamber 10 so as to be included in the pressure chamber 10 in plan view, so that the center of the active portion of the piezoelectric sheet 41 is disposed at the center of the pressure chamber 10. The displacement of the piezoelectric sheets 41 to 43 is increased toward a position facing the vicinity of the center of the active portion, that is, the centroid of the individual electrode 35. Accordingly, if the center of the active portion is disposed at the center of the pressure chamber 10, it may be possible to efficiently apply pressure to the ink contained in the pressure chamber 10.

Figure 6A:
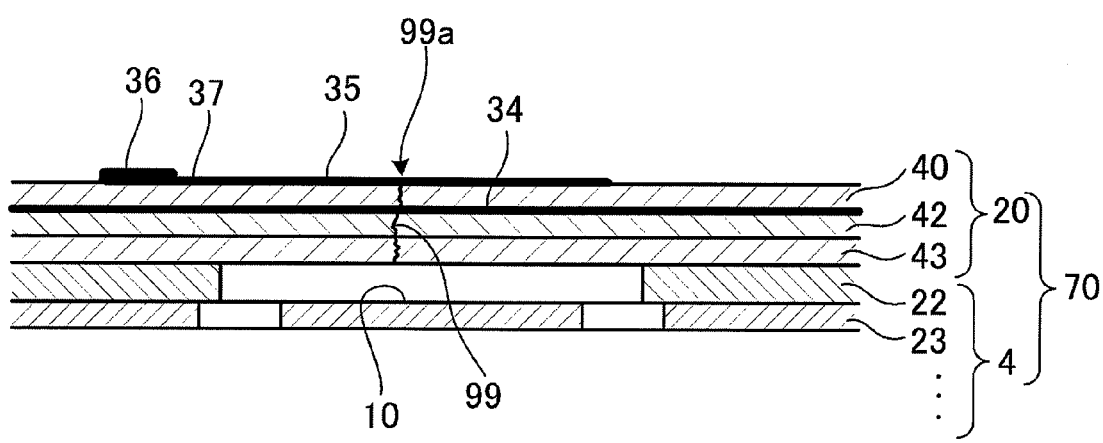
FIG. 6A is a view corresponding to FIG. 5A when a crack is generated in an actuator unit.

Meanwhile, a small crack may be generated at the individual electrode 35, the common electrode 34, or the piezoelectric sheets 41 to 43 due to circumstances during manufacture or use. The small crack hardly causes obstruction alone. However, if the actuator unit 20 continues to be driven plural times, the crack would grow due to the unimorph deformation of the piezoelectric sheets 41 to 43 and pass through the sheets or the electrode. If the crack is connected to another crack, the cracks reach the upper surface of the individual electrode 35 from the pressure chamber 10 like the crack 99 shown in FIG. 6A. If the above-described crack 99 is generated, the ink contained in the pressure chamber 10 leaks to the surface of the individual electrode 35 and reaches adjacent individual electrodes 35. Therefore, there is a concern that a short circuit is caused between electrodes.

Figure 6B:
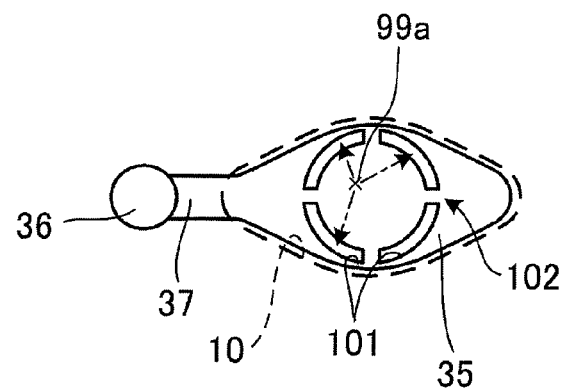
FIG. 6B is a plan view of an individual electrode when a crack is generated in an actuator unit.
Figure 7:
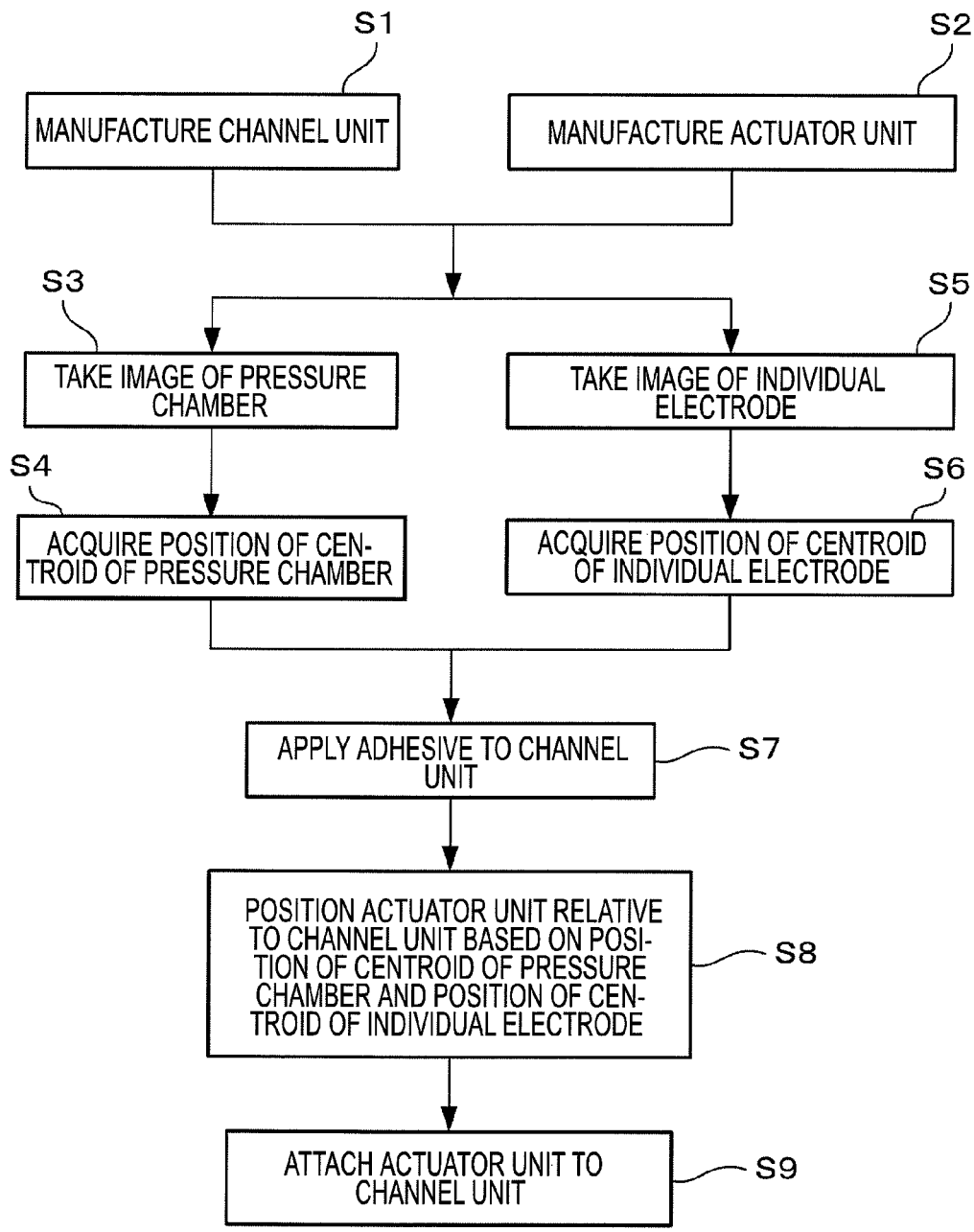
FIG. 7 is a flowchart illustrating a part of steps for manufacturing the ink jet head of FIGS. 1 to 5B.

In contrast, according to this exemplary embodiment, even though ink leaks from an opening 99a of the crack, which is opened to the upper surface of the individual electrode 35, in a direction which is indicated by an arrow shown by a dashed-dotted line, the ink does not reach adjacent individual electrodes 35 because flowing into the grooves 101 as shown in FIG. 6B. Accordingly, a short circuit, which is caused between the individual electrodes 35 by the leaked ink, is suppressed.

Further, as shown in FIG. 5B, each of the grooves 101 of this exemplary embodiment is formed so as to extend in a direction crossing a direction from the centroid of the individual electrode 35 to an adjacent individual electrode 35. Accordingly, it becomes sure to block the ink which leaks from the crack and approaches adjacent electrodes.

Furthermore, the grooves 101 of this exemplary embodiment are formed to substantially surround the centroid of the individual electrode 35. Meanwhile, in the vicinity of the centroid of the individual electrode 35, the amount of unimorph deformation is large as described above, a crack is relatively easily generated, and leakage of the ink occurs easily due to the cracks. Since the grooves 101 surround the above-described portion, it may be possible to more reliably suppress a short circuit of the electrode, which is caused by the leakage of ink.

Further, the grooves 101 are formed in the shape of an arc which has a center at the centroid of the individual electrode 35. Accordingly, it may be possible to cover a wide range in a circumferential direction, which corresponds to a center in the vicinity of the centroid, with relatively short grooves.

Furthermore, two connecting portions of the connecting portions 102 of this exemplary embodiment are disposed at positions which face the corners of the pressure chamber 10. In the vicinity of the position facing the corner of the pressure chamber 10, displacement is regulated by two side walls defining the corner, so that the amount of unimorph deformation is small. Accordingly, it is easy to avoid the cutting of the connecting portion 102 which is caused by the unimorph deformation.

Steps of manufacturing the ink jet head 1 according to this exemplary embodiment will be described below. In order to manufacture the ink jet head 1, components, such as the channel unit 4 and the actuator unit 20, are separately manufactured and assembled.

A step (Step S1) of manufacturing the channel unit 4 will be described first. Holes forming the ink channel of FIG. 4 are formed at the plates 22 to 29, respectively, by performing etching on the plates 22 to 29 of the plates 22 to 30 of the channel unit 4 except for the nozzle plate 30. In more detail, while a patterned photoresist is sued as a mask, holes forming the ink channel are formed by performing etching on the surface on which a resist is formed. A plurality of holes forming the nozzles 8 is formed at the nozzle plate 30 by a punch.

After that, nine plates 22 to 30, which are aligned so that holes forming the pressure chamber 10, holes forming the nozzle 8, or the like communicate with each other and form the individual ink channel 31, are laminated with an epoxy thermosetting adhesive therebetween. Further, the nine plates 22 to 30 are pressed while being heated up to a temperature not lower than the curing temperature of the thermosetting adhesive. Accordingly, the thermosetting adhesive is cured and the nine plates 22 to 30 are fixed to each other, so that the channel unit 4 shown in FIG. 4 is completed.

A step (Step S2) of manufacturing the actuator unit 20 will be described. First, a plurality of piezoelectric ceramic green sheets for forming the piezoelectric sheets 41 to 43 are prepared. The green sheets are formed in expectation of the amount of contraction caused by firing, in advance. Conductive paste is screen-printed on the surface of some of the green sheets so as to form a pattern of the common electrode 34.

After that, while the green sheets are aligned with each other, an unprinted green sheet is laminated so as to be interposed between the green sheets on which the conductive paste has been printed. If the laminated green sheet is fired, three green sheets form the piezoelectric sheets 41 to 43 and the conductive paste forms the common electrode 34.

Subsequently, conductive paste is screen-printed so as to form patterns of the individual electrode 35 and the extension portion 37 on the surface of the piezoelectric sheet 41 and is then fired, so that the individual electrode 35 is formed. In addition, gold containing glass frit is printed on the extension portion 37, so that the land 36 is formed. Accordingly, the actuator unit 20 is completed.

Meanwhile, when being disposed on the channel unit 4, the actuator units 20 are formed so as to lie over all pressure chambers 10 belonging to one pressure chamber group 9. Accordingly, it is possible to densely arrange the individual electrodes 35 on the piezoelectric sheet 41 by using screen printing.

A step of attaching the actuator units 20 to the channel unit 4 will be described. When the actuator unit 20 is attached to the channel unit 4, the actuator units 20 and the channel unit 4 should be positioned so that the centroids of the pressure chambers 10 overlap the centroids of the individual electrodes 35 in plan view as shown in FIG. 5B. Accordingly, in this exemplary embodiment, the positions of the centroids of the pressure chambers 10 and the positions of the centroids of the individual electrodes 35 are previously acquired in order to position the actuator units 20 and the channel unit 4 (Steps S3 to S6).

Figure 8:
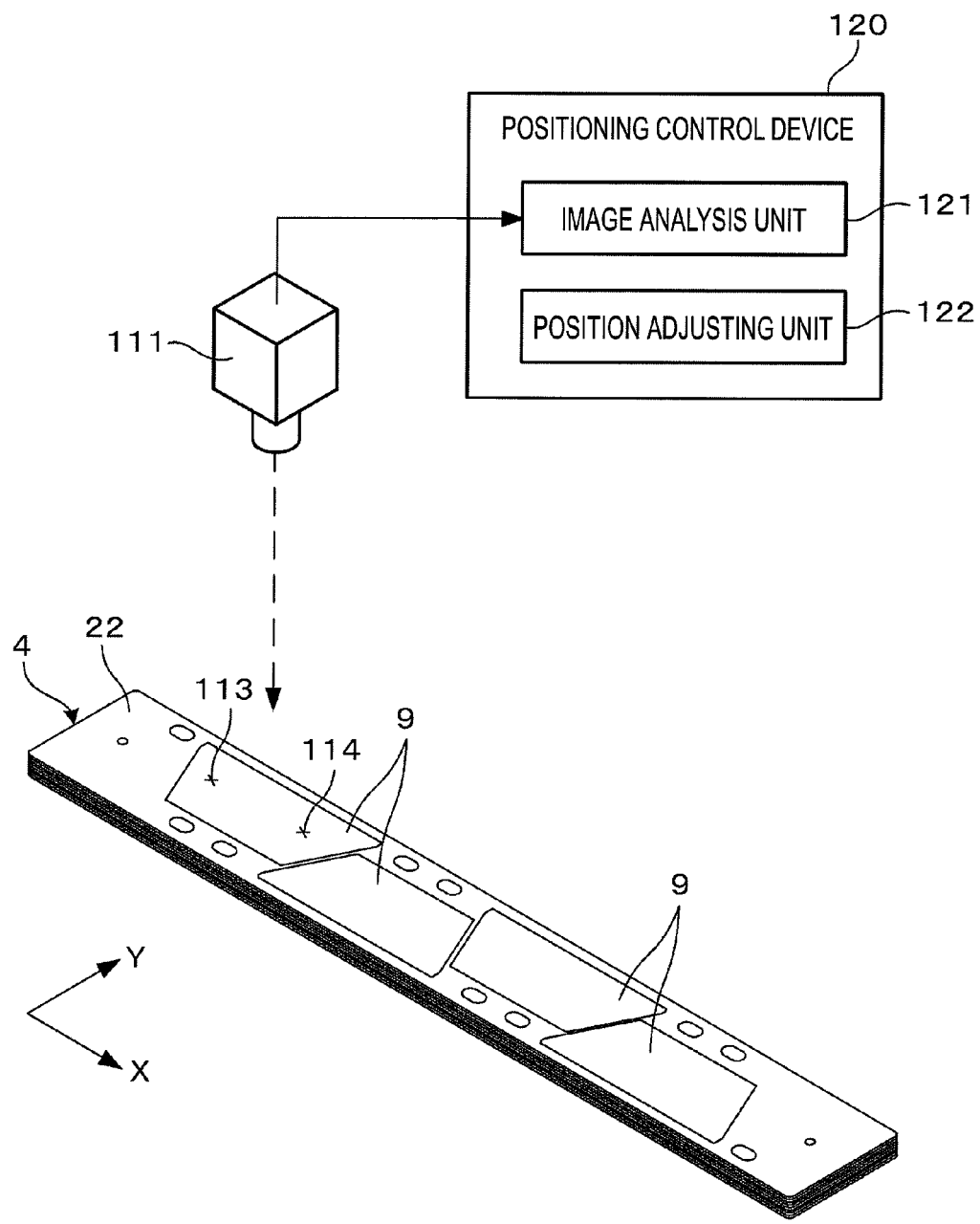
FIG. 8 is a perspective view of a channel unit when an image of the pressure chamber is taken by an image sensor.

A step of acquiring the positions of the centroids of the pressure chambers 10 is as follows: first, an image of the surface of the channel unit 4 to which the pressure chambers 10 are opened, that is, the surface of the cavity plate 22 is taken by an image sensor 111 as shown in FIG. 8 (Step S3; liquid chamber imaging step). For example, a Charge Coupled Device (CCD) image sensor, a Complementary Metal Oxide Semiconductor (CMOS) image sensor, or the like may be used as the image sensor 111.

The image sensor 111 takes an image of a region, which is used in positioning and includes pressure chambers 10, of each of four pressure chamber groups 9. In this exemplary embodiment, as an example, two pressure chambers 10 of each of the pressure chamber groups 9 are used in positioning. In FIG. 8, X marks 113 and 114 indicate the positions of the centroids of the two pressure chambers 10 of one pressure chamber group 9 which are used in positioning, respectively.

Image data, which correspond to the images taken by the image sensor 111, are sent to a positioning control device 120. The positioning control device 120 includes an image analysis unit 121 which analyzes the image data sent from the image sensor 111, and a position adjusting unit 122 which adjusts the position of the actuator unit 20 when the actuator unit 20 is positioned. The positioning control device 120 is formed of hardware, such as a processor circuit and a memory circuit, and software such as a program which causes the hardware function as the image analysis unit 121 and the position adjusting unit 122. The image analysis unit 121 acquires the positions of the centroids 113 and 114 of two pressure chambers 10 based on the image data sent from the image sensor 111 (Step S4; liquid chamber centroid acquiring step). The positions of the centroids 113 and 114 are acquired as the positions on an X-Y coordinate system which is set in a plane parallel to the upper surface of the channel unit 4.

A method of acquiring the position of the centroid of the pressure chamber 10 by the image analysis unit 121, is as follows: the pressure chamber 10 has a substantially rhombic shape as shown in FIG. 5B. The image analysis unit 121 acquires the outline of the pressure chamber 10 through image analysis, and acquires a linear region at the end of the pressure chamber 10. The linear region corresponds to a part of four sides of the rhombus. Further, the position of the centroid of the pressure chamber is acquired from the positional relationship between the four sides of the rhombus. Since the pressure chamber 10 is formed by performing etching as described above, the four sides of the rhombus are relatively accurately shown in the outline of the pressure chamber 10. Accordingly, the image analysis unit 121 can relatively accurately acquire the position of the centroid from the outline of the pressure chamber 10.

Figure 9:
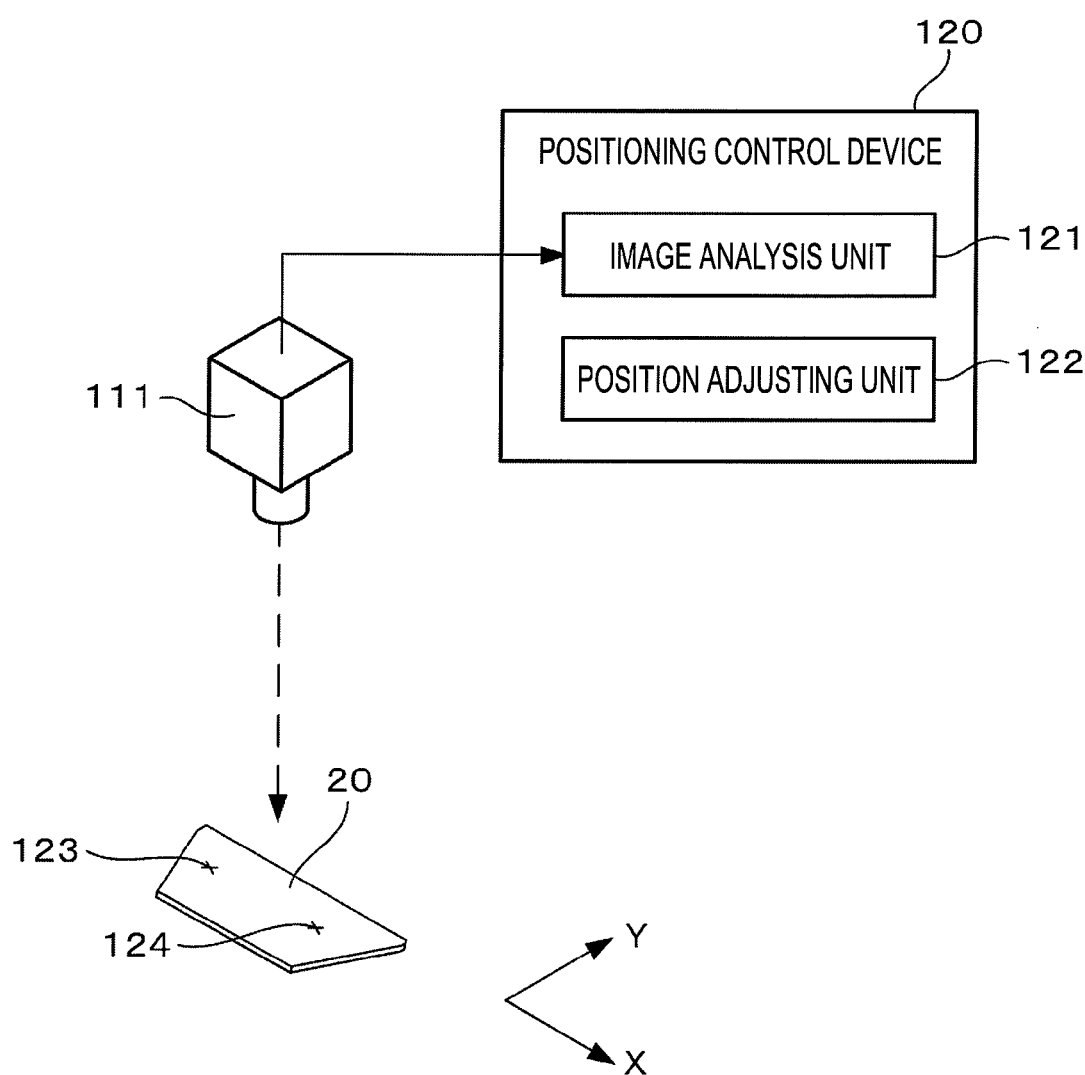
FIG. 9 is a perspective view of the actuator unit when an image of the individual electrode is taken by the image sensor.

Further, an image of the surface of the actuator unit 20 on which the individual electrode 35 is formed is taken by the image sensor 111 shown in FIG. 9 (Step S5; electrode imaging step). In this case, the actuator unit 20 is disposed along an X-Y plane which is parallel to the X-Y coordinate system. The image sensor 111 takes an image of a region, which includes two individual electrodes 35 corresponding to two pressure chambers 10 used in positioning, of the surface of each actuator unit 20. In FIG. 9, X marks 123 and 124 indicate the positions of the centroids of the two individual electrodes 35 corresponding to the two pressure chambers 10 which are used in positioning, respectively.

Image data, which correspond to the images taken by the image sensor 111, are sent to the image analysis unit 121. The image analysis unit 121 acquires the positions of the centroids of the two individual electrodes 35 based on the image data sent from the image sensor 111 as positions on the X-Y coordinate system (Step S6; electrode centroid acquiring step).

In this case, it is considered that the position of the centroid of the individual electrode 35 is acquired in the same manner as the pressure chamber 10. Since the individual electrode 35 also has a substantially rhombic shape like the pressure chamber 10 and a linear region of the outline of the individual electrode 35 can be accurately acquired, it is also possible to accurately acquire the position of the centroid of the individual electrode 35 from a positional relationship between the four sides of the rhombus.

However, the individual electrode 35 is formed by screen printing, unlike the pressure chamber 10. In the case of the screen printing, a printing plate extends or it may not be possible to secure sufficient printing accuracy. In this case, there are concerns that the individual electrode 35 is not accurately formed in an expected shape, and it may be difficult to recognize the linear region of the outline of the individual electrode 35 through image analysis. That is, since the individual electrode 35 has rounded corners, it is difficult to recognize which range is treated as a linear range unless the individual electrode is accurately formed in the expected shape.

Therefore, in this exemplary embodiment, the position of the centroid of the individual electrode 35 is acquired as follows: four connecting portions 102 are formed at the individual electrode 35 as shown in FIG. 5B. As described above, the centroid of the individual electrode 35 is positioned at an intersection between a straight line connecting two connecting portions 102 of the four connecting portions 102 which are most distant from each other and a straight line connecting the other two connecting portions 102. The image analysis unit 121 acquires the positions of the four connecting portions 102, and acquires the position of the centroid of the individual electrode 35 based on the relationship between the positions of the connecting portions 102 and the position of the centroid.

Alternatively, the image analysis unit 121 may acquire the position of the centroid of the individual electrode 35 based on the grooves 101 which are formed at the individual electrode 35. All of the grooves 101 are formed along arcs which have the same radius and have a center at the position of the centroid of the individual electrode 35. Accordingly, if the positions of three different points on the grooves 101 are acquired, it may be possible to acquire the position, which is equidistant from the three points, as the position of the centroid of the individual electrode 35. In this case, it is preferable that the three points be acquired from three different grooves 101 of the four grooves 101, respectively. Alternatively, the position of the centroid of the individual electrode may be acquired from the positions of four or more points.

Since the connecting portion 102 is a narrow region which is interposed between the grooves 101, it is easy to acquire an accurate position in image analysis. Further, even when a plurality of points on the grooves 101 is used, it is easy to recognize the groove 101 itself as compared to when the linear region of the outline of the individual electrode 35 is acquired. Therefore, it may be possible to accurately acquire the position of the centroid of the individual electrode 35 by using the connecting portions 102 or the grooves 101.

After that, a thermosetting adhesive is applied to the regions, on which the pressure chamber groups 9 are formed, of the upper surface of the channel unit 4 by using a bar coater (Step S7). Further, the channel unit 4 and the actuator units 20 are positioned based on the positions of the centroids of the pressure chambers 10 and the positions of the centroids of the individual electrodes 35, which are acquired in Steps S4 and S6 (Step S8).

Specifically, the position adjusting unit 122 adjusts the positions of the actuator units 20 based on the XY coordinates of the positions of the centroids which are acquired by the image analysis unit 121. The actuator units 20 are supported above the pressure chamber groups 9 by a jig, and the jig may move the actuator units 20 along an X-Y plane in directions which are indicated by arrows 131 to 135 of FIG. 10. The arrows 131 and 133 indicate translational movement in a direction parallel to an X direction (main scanning direction), the arrows 132 and 134 indicate translational movement in a direction parallel to a Y direction (sub-scanning direction), and the arrow 135 indicates rotational movement in the X-Y plane.

Figure 10:
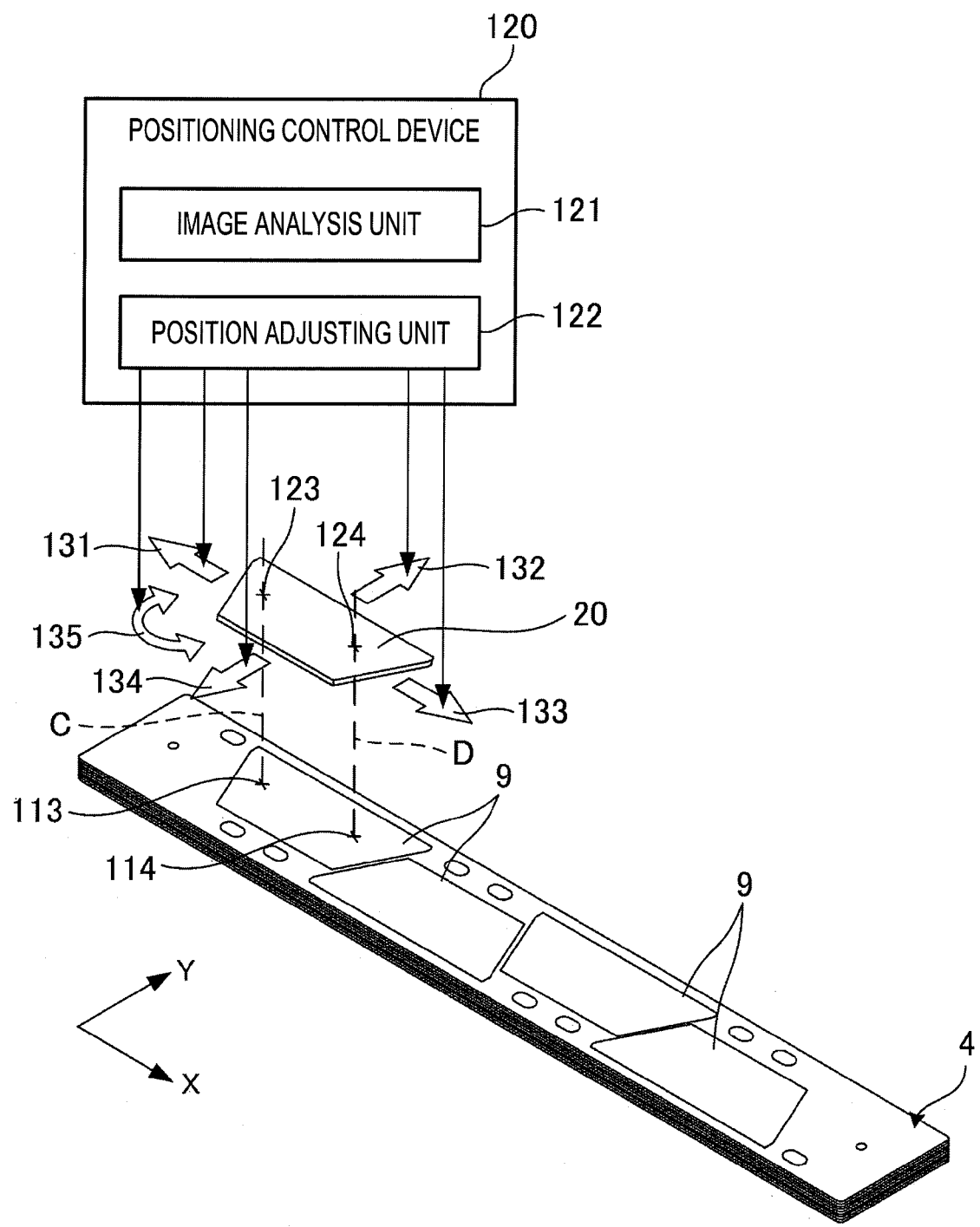
FIG. 10 is a perspective view of the actuator unit and the channel unit when the actuator unit and the channel unit are positioned.

The position adjusting unit 122 moves the actuator unit 20 to the jig so that the positions 123 and 124 of the centroids of the individual electrodes 35 and the positions 113 and 114 of the centroids of the pressure chambers 10 correspond to each other on the X-Y coordinate system. Accordingly, as shown in FIG. 10, the positions 113 and 123 of the centroids are disposed on an axis C perpendicular to the X-Y plane, and the positions 114 and 124 of the centroids are disposed on an axis D perpendicular to the X-Y plane.

After that, the jig supporting the actuator unit 20 moves the actuator unit 20 along the axes C and D, and places the actuator unit on the pressure chamber group 9. In this case, the actuator unit is positioned at Step S8 so that the positions of the centroids of the individual electrodes 35 and the positions of the centroids of the pressure chambers 10 overlap each other on the X-Y coordinate system. Accordingly, the actuator unit 20 is appropriately disposed so that the individual electrodes 35 and the pressure chambers 10 exactly have a positional relationship shown in FIG. 5B in plan view.

Then, a laminated body in which the channel unit 4 and the actuator unit 20 are laminated is pressed by a pressurizing device (not shown) while being heated up to a temperature not lower than the curing temperature of the thermosetting adhesive by a heating device (not shown). Accordingly, the channel unit 4 and the actuator unit 20 are attached to each other (Step S9).

According to the above-described manufacturing method, the actuator unit 20 and the channel unit 4 are manufactured, respectively, and the images of the pressure chambers 10 and the individual electrodes 35 are taken. Then, the positions of the respective centroids are acquired from the imaging results. Further, the actuator unit 20 and the channel unit 4 are positioned based on the acquired positions of the centroids. As described above, the actuator unit and the channel unit are positioned based on the position of the centroid after the positions of the centroids are actually measured. Accordingly, even though displacement occurs from a designed position during the formation of the individual electrode 35 or the pressure chamber 10, it may be possible to relatively accurately align the pressure chamber 10 with the individual electrode 35.

Modifications of the individual electrode will be described below. FIGS. 11A to 11D are plan views of individual electrodes 135a to 135d which may be employed instead of the individual electrode 35 in the above-described exemplary embodiment.

Figure 11A:
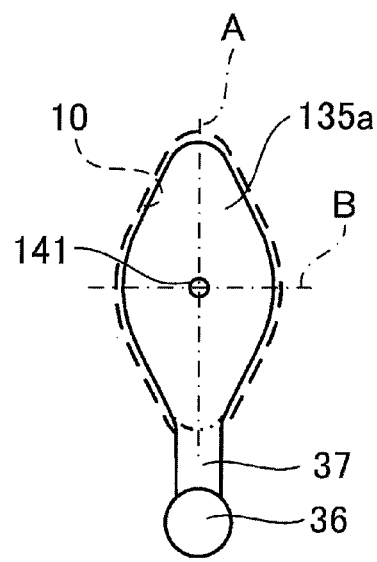
FIGS. 11A to 11D show modifications of a peripheral portion of the individual electrode.

As shown in FIG. 11A, an individual electrode 135a includes a circular groove 141 which is formed at the position of the centroid thereof as a center. If only a circular groove is formed in the vicinity of the position of the centroid like in the individual electrode 135a, it may be possible to cause ink, which leaks in the vicinity of the centroid, flow into the groove. The shape of the groove is not limited to a circular shape and may be, for example, a polygonal shape. Further, according to the individual electrode 135a, it may be possible to directly acquire the position of the centroid of the individual electrode 135a by acquiring the position of the groove 141 through image analysis during the manufacture of the ink jet head 1.

Figure 11B:
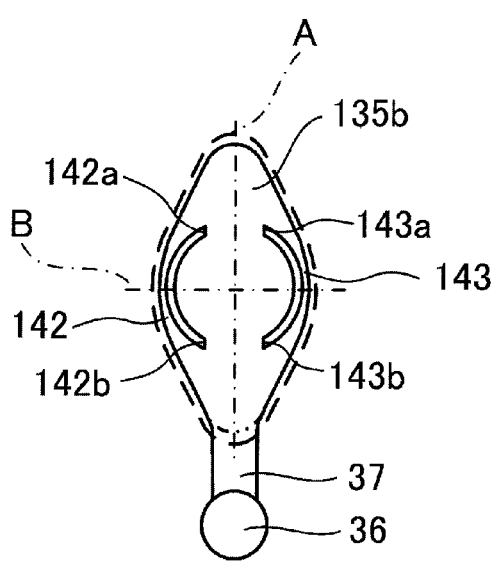

As shown in FIG. 11B, grooves 142 and 143 are formed at an individual electrode 135b. Each of the grooves 142 and 143 is also formed in the shape of an arc, which has a center at the centroid of the individual electrode 135b, like the above-described groove 101, and extends to the vicinity of the outer peripheral edge of the individual electrode 135b. A peripheral portion of one end 142a of the groove 142 and a peripheral portion of the other end 142b of the groove are cut inside the individual electrode 135b. Further, a peripheral portion of one end 143a of the groove 143 and a peripheral portion of the other end 143b of the groove are cut inside the individual electrode 135b.

The grooves 142 and 143 are formed between adjacent individual electrodes 135b which are close to the centroid of the individual electrode 135b, and ink leaking from at least the vicinity of the centroid in this direction flows into the grooves 142 and 143. Accordingly, it may be possible to prevent ink from reaching the adjacent individual electrodes 135b. Further, each of the grooves 142 and 143 is formed in the shape of an arc which has a center at the centroid of the individual electrode 135b. Accordingly, if the outlines of the grooves 142 and 143 are recognized and the positions of three or more points on the outlines are acquired, it is possible to easily acquire the position of the centroid of the individual electrode 135b as a position which is equidistant from the points.

Figure 11C:
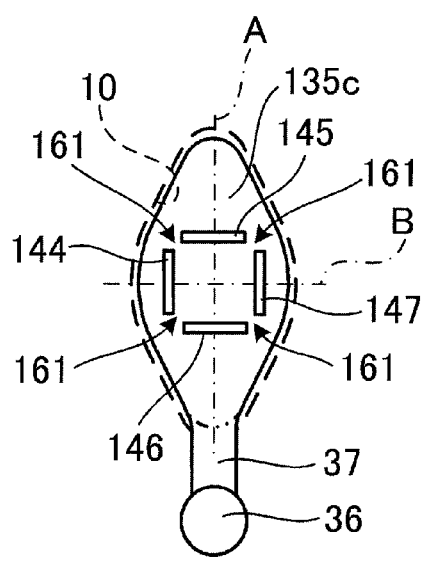

As shown in FIG. 11C, grooves 144 to 147 are formed along sides of a square, which has a center at the position of the centroid of the individual electrode 135c. The grooves 144 and 147 are straight and parallel to a long diagonal line of the individual electrode 135c, and the grooves 145 and 146 are parallel to a short diagonal line of the individual electrode. The grooves 144 to 147 are formed so as to extend in directions directing adjacent individual electrodes 135c (for example, in directions parallel to straight lines A and B). The ink, which leaks from the vicinity of the centroid of the individual electrode 135c, is prevented from reaching adjacent individual electrodes 135c by the grooves 144 to 147. Further, connecting portions 161 are formed between the ends of the grooves 144 to 147. Four connecting portions 161 are disposed at vertexes of a square which has a center at the centroid of the individual electrode 135c. Accordingly, it is easy to acquire the position of the centroid of the individual electrode 135c on the basis of the positions of the connecting portions 161.

Figure 11D:
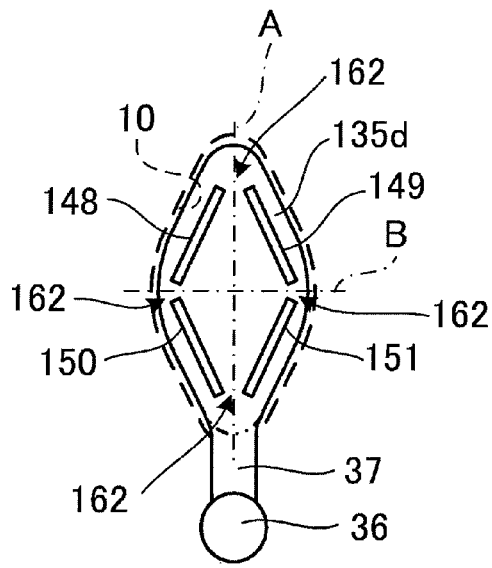

As shown in FIG. 11D, linear grooves 148 to 151 are formed along sides of a rhombus, which has a center at the position of the centroid of the individual electrode 135d. The grooves 148 to 151 are disposed along the sides of the individual electrode 135c, respectively. The ink, which leaks from the vicinity of the centroid of the individual electrode 135d, is prevented from reaching adjacent individual electrodes 135d by the grooves 148 to 151. Since the grooves 148 to 151 are formed in a rhombic shape which is substantially similar to the shape of the individual electrode 135d, the grooves are easily formed so as to surround a region which is as large as possible and includes the position of the centroid of the individual electrode 135d.

Further, connecting portions 162 are formed between the ends of the grooves 148 to 151. Four connecting portions 162 are disposed at vertexes of a rhombus which has a center at the centroid of the individual electrode 135d. Accordingly, it is easy to acquire the position of the centroid of the individual electrode 135d on the basis of the positions of the connecting portions 162.

Furthermore, since all connecting portions 162 are disposed near positions which face the corners of the pressure chamber 10, the connecting portions 162 are hardly cut by unimorph deformation.

In addition, since each of the grooves 148 to 151 is formed in the shape of a straight line which is parallel to each of the sides of a rhombus, it is also possible to easily acquire the position of the centroid of the individual electrode 135d based on a gap between the linear grooves facing each other.

OTHER MODIFICATIONS

While the present invention has been shown and described with reference to certain exemplary embodiments thereof, it will be understood by those skilled in the art that various changes in form and details may be made therein without departing from the spirit and scope of the invention as defined by the appended claims.

For example, a unimorph type piezoelectric actuator has been employed as the actuator unit 20 in the above-described embodiments. However, as long as an actuator includes an electrode which faces the pressure chamber 10 through a deformation layer such as the piezoelectric sheet 23, any actuator may be used. If the present invention is applied to an actuator having a concern that a crack is generated to the surface of the electrode from the pressure chamber 10 due to the deformation of the deformation layer, it is possible to suppress a short circuit which is caused between other conductive portions and the electrode by ink leaking from the crack.

Further, the connecting portions 102 securing the conduction of the individual electrode 35 have been formed in the above-described embodiments. However, if the grooves 101 do not pass through the individual electrode 35, the connecting portions 102 may not be formed. In this case, for example, the grooves 101 may be completely formed along the entire circumference of one circle.

Furthermore, in the above-described embodiments, the present invention has been applied to an ink jet head which discharges ink from nozzles. However, the object to which the present invention may be applied is not limited to the ink jet head. For example, the present invention may be applied to a droplet discharge head which forms fine wiring patterns on a substrate by discharging conductive paste, forms a high-definition display by discharging an organic luminescent material onto a substrate, or forms a microelectronic device such as an optical waveguide by discharging an optical resin onto a substrate.

What is claimed is:

1. A droplet discharge head comprising:
   a discharge port through which a droplet is discharged;
   a liquid channel which communicates with the discharge port; and
   an actuator which includes a deformation layer defining a part of wall surfaces of the liquid channel and an electrode facing the liquid channel through the deformation layer, and which causes the deformation layer to deform toward the liquid channel when a drive signal is supplied to the electrode,
   wherein a groove is formed on a surface of the electrode opposite to the deformation layer, and
   wherein the groove is configured to receive liquid therein when the liquid leaks to an exposed surface of the electrode.
2. The droplet discharge head according to claim 1,
   wherein the actuator includes a plurality of the electrodes, each being formed with a groove on the surface thereof, and
   wherein the groove of one of the electrodes extends in a direction crossing a direction from a centroid of the one of the electrodes to an adjacent electrode.
3. The droplet discharge head according to claim 2,
   wherein the groove of each electrode extends along an arc with a centroid of the corresponding electrode as a center.
4. The droplet discharge head according to claim 2,
   wherein the groove of each electrode substantially surrounds the centroid of the corresponding electrode, and
   wherein each of the electrodes is formed with a connecting portion which electrically connects an inner region which is substantially surrounded by the groove with an outer region outside the inner region.
5. The droplet discharge head according to claim 4,
   wherein at least two connecting portions are formed on each electrode, and
   wherein the centroid of each electrode is positioned on a line segment which connects the two connecting portions of the corresponding electrode.
6. The droplet discharge head according to claim 5,
   wherein at least four connecting portions are formed on each electrode, and
   wherein the centroid of each electrode is positioned at an intersection between a line segment which connects two connecting portions of the four connecting portions and a line segment which connects the other two connecting portions in the corresponding electrode.
7. The droplet discharge head according to claim 1,
   wherein an amount of deformation of the actuator becomes largest in the vicinity of the centroid of the electrode when the deformation layer is deformed toward the liquid channel.
8. The droplet discharge head according to claim 1,
   wherein the groove passes through the electrode.
9. The droplet discharge head according to claim 1,
   wherein the groove has a circular shape with a center at a centroid of the electrode.
10. The droplet discharge head according to claim 1,
    wherein the groove extends in straight.

* * * * *